(12) United States Patent
Rosen et al.

(10) Patent No.: US 9,057,146 B2
(45) Date of Patent: *Jun. 16, 2015

(54) EDDY CURRENT THICKNESS MEASUREMENT APPARATUS

(75) Inventors: Gary J. Rosen, Manchester, MA (US); Frank Sinclair, Quincy, MA (US); Alexander Soskov, Danvers, MA (US); James S. Buff, Brookline, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 461 days.

This patent is subject to a terminal disclaimer.

(21) Appl. No.: 12/862,187

(22) Filed: Aug. 24, 2010

(65) Prior Publication Data

US 2012/0048496 A1   Mar. 1, 2012

(51) Int. Cl.

| | |
|---|---|
| *B22D 46/00* | (2006.01) |
| *B22D 21/00* | (2006.01) |
| *G01B 7/06* | (2006.01) |
| *B22D 2/00* | (2006.01) |
| *C30B 11/00* | (2006.01) |
| *B22D 11/12* | (2006.01) |
| *B22D 11/14* | (2006.01) |

(Continued)

(52) U.S. Cl.
CPC ............... *C30B 11/00* (2013.01); *C30B 29/64* (2013.01); *C30B 29/08* (2013.01); *C30B 29/406* (2013.01); *C30B 29/36* (2013.01); *Y10T 117/1088* (2015.01); *Y10T 117/1068* (2015.01); *Y10T 117/1044* (2015.01); *Y10T 117/1032* (2015.01); *Y10T 117/1048* (2015.01); *Y10T 117/1004* (2015.01); *Y10T 117/1008* (2015.01); *B22D 11/1206* (2013.01); *B22D 11/143* (2013.01); *C30B 15/00* (2013.01); *C30B 29/06* (2013.01); *C30B 35/00* (2013.01); *G01B 7/105* (2013.01); *G01B 7/107* (2013.01)

(58) Field of Classification Search
CPC ........ C30B 29/06; C30B 35/00; C30B 29/64; C30B 11/00; C30B 15/00; B22D 11/1206; B22D 11/143; G01B 7/105; G01B 7/107
USPC .................. 117/201; 164/4.1, 151.2; 324/230
See application file for complete search history.

(56) References Cited

U.S. PATENT DOCUMENTS

| | | |
|---|---|---|
| 3,651,398 A | 3/1972 | Urmenyi |
| 3,986,105 A | 10/1976 | Nix et al. |

(Continued)

FOREIGN PATENT DOCUMENTS

| | | |
|---|---|---|
| TW | 201024480 A1 | 7/2010 |
| WO | 2005104244 A | 11/2005 |
| WO | 2008039816 A1 | 4/2008 |

OTHER PUBLICATIONS

V.A Bunyaev, V.T. Boldrev, V.V. Dolgikh, "Eddy Current-Type Coating Thickness Gauge," Izmeritel'naya Tekhnika, Nov. 1991, No. 11, p. 31, Plenum Publishing Corp.

(Continued)

*Primary Examiner* — Michael Kornakov
*Assistant Examiner* — Hua Qi (57) ABSTRACT

A sheet of a material is disposed in a melt of the material. The sheet is formed using a cooling plate in one instance. An exciting coil and sensing coil are positioned downstream of the cooling plate. The exciting coil and sensing coil use eddy currents to determine a thickness of the solid sheet on top of the melt.

18 Claims, 5 Drawing Sheets

(51) Int. Cl.
*C30B 15/00* (2006.01)
*C30B 29/06* (2006.01)
*C30B 35/00* (2006.01)
*C30B 29/64* (2006.01)
*C30B 29/08* (2006.01)
*C30B 29/40* (2006.01)
*C30B 29/36* (2006.01)

(56) References Cited

U.S. PATENT DOCUMENTS

| | | | |
|---|---|---|---|
| 4,264,407 A * | 4/1981 | Shudo et al. | 117/30 |
| 4,590,988 A * | 5/1986 | Fukuoka et al. | 164/463 |
| 4,599,132 A * | 7/1986 | Jewett et al. | 117/27 |
| 5,448,921 A * | 9/1995 | Cage et al. | 73/861.357 |
| 5,483,160 A * | 1/1996 | Gulliver et al. | 324/242 |
| 5,781,008 A * | 7/1998 | Muller et al. | 324/230 |
| 6,593,738 B2 | 7/2003 | Kesil et al. | |
| 2003/0067298 A1* | 4/2003 | Nagano et al. | 324/230 |
| 2008/0118663 A1* | 5/2008 | Choi et al. | 427/579 |
| 2009/0231597 A1 | 9/2009 | Rowland et al. | |
| 2009/0233396 A1 | 9/2009 | Kellerman et al. | |
| 2009/0302281 A1* | 12/2009 | Kellerman et al. | 252/519.1 |
| 2010/0221142 A1 | 9/2010 | Kellerman et al. | |

OTHER PUBLICATIONS

Dengfeng Chen et al., "Application of Pulsed Eddy Current and Ultrasonic Sensors in Paint Film Thickness Measurement," 2009 Chinese Control and Decision Conference (CCDC 2009), 2009, 978-1-4244-2723-9, pp. 4461-4464, IEEE.

J. Forbriger et al., "Measurement of the Spatio-Temporal Distribution of Harmonic and Transient Eddy Current in Liquid Metal," Meas. Sci. Tech., 2008, vol. 19, pp. 1-7, IOP Publishing Ltd. UK.

Gary Rosen, "Eddy Current Diagnostics," Clarkson University MAE Report, Apr. 1994, No. 288, pp. 22-32.

Jerry A. Stefani & John K. Tien, "Multifrequency Eddy Current Diagnostics of Axial and Radial Thermal Profiles During Silicon Crystal Growth, " J. Crystal Growth, 1990, vol. 106, pp. 611-621.

Frank Stefani, Gunter Gerbeth, and Thomas Gundrum, "A Contactless Inductive Velocity Reconstruction Method for Metallic and Semiconducting Melts," Materials and Manufacturing Processes, 2004, vol. 19, No. 4, pp. 651-663.

* cited by examiner

EDDY CURRENT THICKNESS MEASUREMENT APPARATUS

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract number DE-EE0000595 awarded by the U.S. Department of Energy.

FIELD

This invention relates to sheet formation from a melt and, more particularly, to measuring the thickness of a solid sheet formed from a melt.

BACKGROUND

While silicon wafers or sheets may be used in the integrated circuit industry, these silicon wafers or sheets also may be used in the solar cell industry. The majority of solar cells are made from silicon wafers, such as single crystal silicon wafers. Currently, a major cost of a crystalline silicon solar cell is the wafer on which the solar cell is made. The efficiency of the solar cell, or the amount of power produced under standard illumination, is limited, in part, by the quality of this wafer. As the demand for solar cells increases with demand for green energy, one goal of the solar cell industry is to lower the cost/power ratio. Any reduction in the cost of manufacturing a wafer without decreasing quality will lower this cost/power ratio and enable the wider availability of this clean energy technology.

The highest efficiency silicon solar cells may have an efficiency of greater than 20%. These are made using electronics-grade monocrystalline silicon wafers. Such wafers may be made by sawing thin slices from a monocrystalline silicon cylindrical boule grown using the Czochralski method. These slices may be less than 200 μm thick. The subsequent sawing process leads to approximately 200 μm of kerf loss, or loss due to the width of a saw blade, per wafer. The cylindrical boule or wafer also may need to be squared off to make a square solar cell. Both the squaring and kerf losses lead to material waste and increased material costs. As solar cells become thinner, the percent of silicon waste per cut increases. Limits to sawing technology may hinder the ability to obtain thinner solar cells.

Other solar cells are made using wafers sawed from polycrystalline silicon ingots. Polycrystalline silicon ingots may be grown faster than monocrystalline silicon. However, the quality of the resulting wafers is lower because there are more defects or grain boundaries and this lower quality results in lower efficiency solar cells. The sawing process for a polycrystalline silicon ingot; is as inefficient as a monocrystalline silicon ingot or boule.

Another solution that may reduce silicon waste is cleaving a wafer from a silicon ingot after ion implantation. For example, hydrogen, helium, or other noble gas ions are implanted beneath the surface of the silicon ingot to form an implanted region. This is followed by a thermal, physical, or chemical treatment to cleave the wafer from the ingot along this implanted region. While cleaving through ion implantation can produce wafers without kerf losses, it has yet to be proven that this method can be employed to produce silicon wafers economically.

Yet another solution is to pull a ribbon of silicon vertically from a melt and then allow the pulled silicon to cool and solidify into a sheet. The removed latent heat during the cooling and solidifying must be removed along the vertical ribbon. This results in a large temperature gradient along the ribbon. This temperature gradient stresses the crystalline silicon ribbon and may result in poor quality multi-grain silicon. The width and thickness of the ribbon also may be limited due to this temperature gradient.

Producing sheets horizontally from a melt may be less expensive than silicon sliced from an ingot and may eliminate kerf loss or loss due to squaring. Sheets produced horizontally from a melt also may be less expensive than silicon cleaved from an ingot using hydrogen ions or other vertically-pulled silicon ribbon methods. Furthermore, separating a sheet horizontally from a melt may improve the crystal quality of the sheet compared to vertically-pulled ribbons. A crystal growth method such as this that can reduce material costs would be a major enabling step to reduce the cost of silicon solar cells. However, the thickness of this sheet may need to be uniform or a specific value for certain solar cell designs. Thus, the thickness may need to be controlled during production. Many thickness measurement devices cannot withstand the high temperature environment of the melt. There is a need in the art for measuring a sheet in a melt and, more particularly, measuring the thickness of a sheet in a melt.

SUMMARY

According to a first aspect of the invention, a sheet-forming apparatus is provided. The sheet-forming apparatus comprises a melt of a material and a sheet of the material disposed in the melt. A cooling plate is configured to form the sheet. An exciting coil and a sensing coil are downstream of the cooling plate. A power source is connected to the exciting coil According to a second aspect of the invention, a measurement; method is provided. The measurement method comprises freezing a sheet of a material in a melt of the material. The melt and the sheet flow through a channel. The thickness of the sheet is measured using an eddy current.

According to a third aspect of the invention, a measurement apparatus is provided. The measurement apparatus comprises an exciting coil and a sensing coil. A power source is configured to energize the exciting coil to produce a time-varying magnetic field. A controller is configured to measure an induced magnetic field in the sensing coil. The controller interprets a signal from the sensing coil to estimate a thickness of a higher resistivity layer disposed on top of a lower resistivity layer.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments of the apparatus and methods herein are described in connection with solar cells. However, these also may be used to produce, for example, integrated circuits, flat panels, light-emitting diodes (LEDs), or other substrates known to those skilled in the art. Furthermore, while a silicon melt is described, the melt may contain germanium, silicon and germanium, gallium, gallium nitride, silicon carbide, other semiconductor materials, or other materials known to those skilled in the art. Thus, the invention is not limited to the specific embodiments described below.

Figure 1:
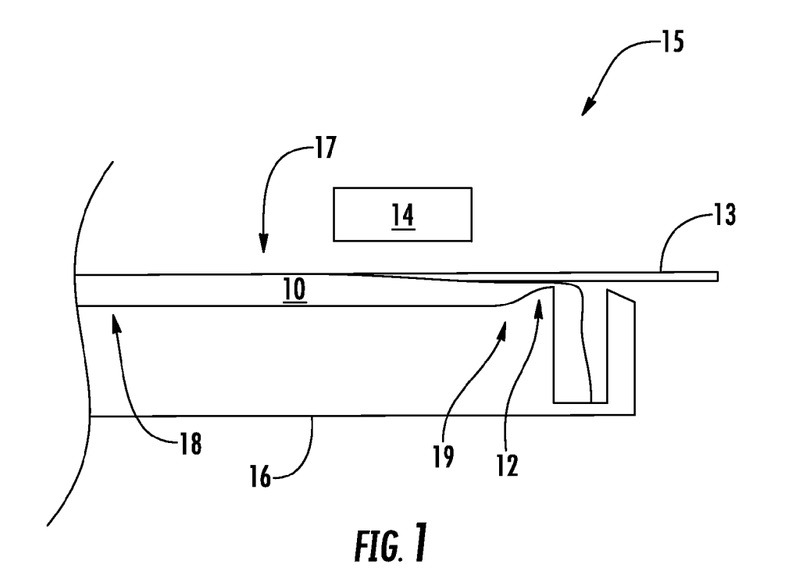
FIG. 1 is a cross-sectional side view of an embodiment of an apparatus that separates a sheet from a melt.

FIG. 1 is a cross-sectional side view of an embodiment of an apparatus that separates a sheet from a melt. The sheet-forming apparatus 15 has a vessel 16. The vessel 16 may be, for example, tungsten, boron nitride, aluminum nitride, molybdenum, graphite, silicon carbide, or quartz. The vessel 16 is configured to contain a melt 10 and in one instance is a crucible. This melt 10 may be silicon. A sheet 13 will be formed on the melt 10. In one instance, the sheet 13 will at least partly float within the melt 10. While the sheet 13 is illustrated in FIG. 1 as floating in the melt 10, the sheet 13 may be at least partially submerged in the melt 10 or may float on top of the melt 10. In one instance, only 10% of the sheet 13 protrudes from above the top of the melt 10. The melt 10 may circulate within the sheet-forming apparatus 15.

This vessel 16 defines at least one channel 17. This channel 17 is configured to hold the melt 10 and the melt 10 flows from a first point 18 to a second point 19 of the channel 17. In one instance, the environment within the channel 17 is still to prevent ripples in the melt 10. The melt 10 may flow due to, for example, a pressure difference, gravity, a gas-lift pump, a screw pump, other types of pumps, or other methods of transport. The melt 10 then flows over the spillway 12. This spillway 12 may be a ramp, a weir, a ledge, a small dam, or a corner and is not limited to the embodiment illustrated in FIG. 1. The spillway 12 may be any shape that allows a sheet 13 to be separated from the melt 10.

In one particular embodiment, the vessel 16 may be maintained at a temperature slightly above approximately 1685 K. For silicon, 1685 K represents the freezing temperature or interface temperature. By maintaining the temperature of the vessel 16 to slightly above the freezing temperature of the melt 10, the cooling plate 14 may function using radiation cooling to obtain the desired freezing rate of the sheet 13 on or in the melt 10. The cooling plate 14 in this particular embodiment is composed of a single segment or section but may include multiple segments or sections in another embodiment. The vessel 16 may be any temperature above the melting temperature of the melt 10. This prevents the melt 10 from solidifying on the vessel 16. In one instance, different regions of the vessel 16 may be heated to different temperatures by imbedding heaters within the vessel 16 and using multi-zone temperature control.

The sheet-forming apparatus 15 includes a cooling plate 4. The cooling plate 14 allows heat extraction that enables the sheet 13 to form on the melt 10. The cooling plate 14 may cause the sheet 13 to freeze on or in the melt 10 when the temperature of the cooling plate 14 is lowered below the freezing temperature of the melt 10. This cooling plate 14 uses radiation cooling and may be fabricated of, for example, graphite, quartz, or silicon carbide. Disturbances to the melt 10 may be reduced while the sheet 13 forms to prevent imperfections in the sheet 13.

The heat extraction of the heat of fusion and heat from the melt 10 over the surface of the melt 10 may enable faster production of the sheet 13 compared to other ribbon pulling methods while maintaining a sheet 13 with low defect density. Cooling a sheet 13 on the surface of the melt 10 or a sheet 13 that floats on the melt 10 allows the latent heat of fusion to be removed slowly and over a large area while having a relatively large sheet 13 extraction rate.

The dimensions of the cooling plate 14 may be increased, both in length and width. Increasing the length may allow a faster sheet 13 extraction rate for the same vertical growth rate and resulting sheet 13 thickness. Increasing the width of the cooling plate 14 may result in a wider sheet 13. Unlike the vertical sheet pulling method, there is no inherent physical limitation oil the width of the sheet 13 produced using embodiments of the apparatus and method described in FIG. 1.

After the sheet 13 is formed on the melt 10, the sheet 13 is separated from the melt 10 using the spillway 12. The melt 10 flows from the first point 18 to the second point 19 of the channel 17. The sheet 13 will flow with the melt 10. This transport of the sheet 13 may be a continuous motion. In one instance, the sheet 13 may flow at approximately the same speed that the surface of the melt 10 flows. Thus, the sheet 13 may form and be transported while at rest with respect to the surface of the melt 10. The shape of the spillway 12 or orientation of the spillway 12 may be altered to change the velocity profile of the melt 10 or sheet 13.

The melt 10 is separated from the sheet 13 at the spillway 12. In one embodiment, the flow of the melt 10 transports the melt 10 over the spillway 12 and may, at least in part, transport the sheet 13 over the spillway 12. This may minimize or prevent breaking a single crystal sheet 13 because no external stress is applied to the sheet 13. Of course, the sheet 13 also may be pulled or have some external force applied. The melt 10 will flow over the spillway 12 away from the sheet 13 in this particular embodiment. Cooling may not be applied at the spillway 12 to prevent thermal shock to the sheet 13. In one embodiment, the separation at the spillway 12 occurs in near-isothermal conditions. The sheet 13 may tend to go straight beyond the spillway 12 in one embodiment. This sheet 13 may be supported after going over the spillway 12 in some instances to prevent breakage.

Figure 2:
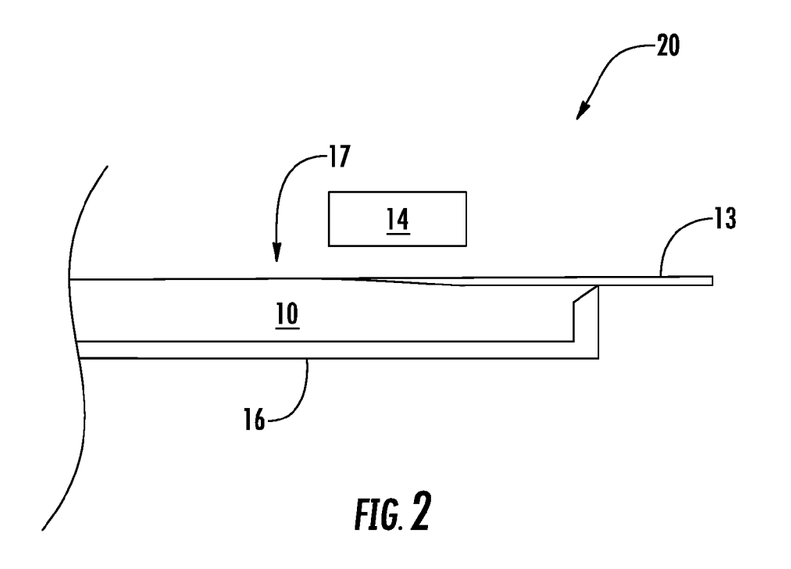
FIG. 2 is a cross-sectional side view of an embodiment of an apparatus that pulls a sheet from a melt.

FIG. 2 is a cross-sectional side view of an embodiment of an apparatus that pulls a sheet from a melt. In this embodiment, the sheet-forming apparatus 20 transports the sheet 13 by pulling the sheet 13 from the melt 10. The melt 10 may not be circulating in a channel 17 in this embodiment and the sheet 13 may be pulled using a seed. A sheet 13 may be formed through cooling by the cooling plate 14 and the resulting sheet 13 may be drawn out of the melt 10.

Both the embodiments of FIGS. 1-2 use a cooling plate 14. Different cooling temperatures across the length of the cooling plate 14, different flow rates of the melt 10 or pull speeds of the sheet 13, the length of the various sections of the sheet-forming apparatus 15 or sheet-forming apparatus 20, or the timing within the sheet-forming apparatus 15 or sheet-forming apparatus 20 may be used for process control. If the melt 10 is silicon, a polycrystalline sheet 13 or single crystal sheet 13 may be formed in the sheet-forming apparatus 15. In either the embodiment of FIG. 1 or FIG. 2, the sheet-forming apparatus 15 or sheet-forming apparatus 20 may be contained in an enclosure that helps maintain the desired temperature.

FIG. 1 and FIG. 2 are only two examples of sheet-forming apparatuses that can form sheets 13 from a melt 10. Other apparatuses or methods of horizontal sheet 13 growth are possible. While the embodiments of the methods and apparatuses described herein are specifically described with respect to the sheet-forming apparatus of FIG. 1, these embodiments may be applied to any horizontal sheet 13 growth method or apparatus, such as that illustrated in FIG. 2. The embodiments also may be applied to a vertical sheet growth method. Thus, the embodiments described herein are not limited solely to the specific embodiments of FIG. 1.

Measuring the thickness of the sheet 13 has many advantages. Such measurements may be used as a feedback mechanism or process control system for production of the sheet 13. This may ensure that the desired thickness of the sheet 13 is formed. In-situ measurement may allow real-time monitoring of the thickness of the sheet 13 as it is formed on the melt 10. This may reduce waste or enable a continuous sheet 13 to be formed.

Liquid silicon is a metal with a conductivity of approximately 1.39E6 S/m. Solid silicon at the melting temperature is an intrinsic semiconductor with a conductivity 5E4 S/m. Thus, solid silicon has a lower conductivity than liquid silicon. Such a conductivity difference allows eddy current measurement to determine the thickness of the sheet 13.

Figure 3:
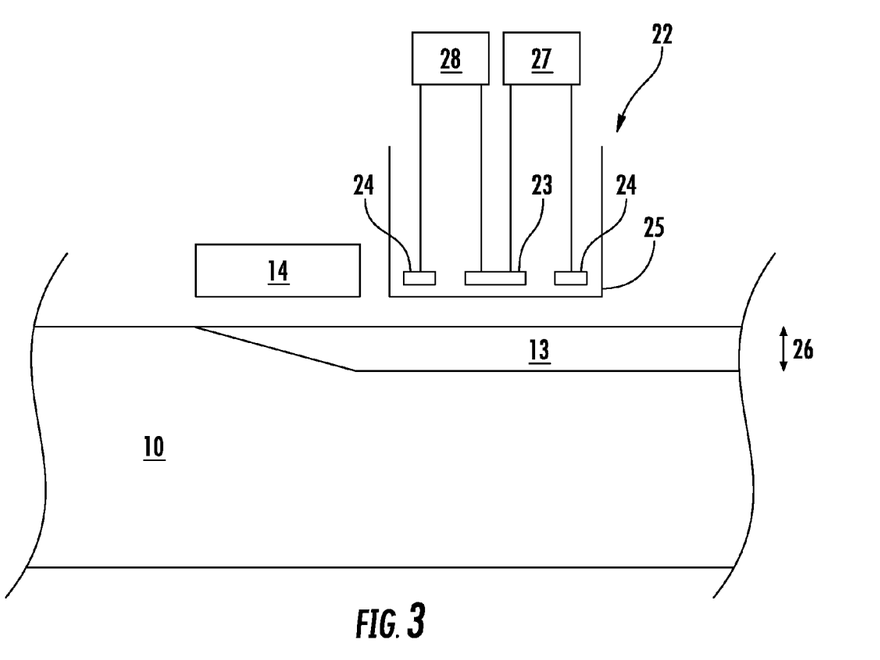
FIG. 3 is a cross-sectional side view of an embodiment of an eddy current measurement system.
Figure 4:
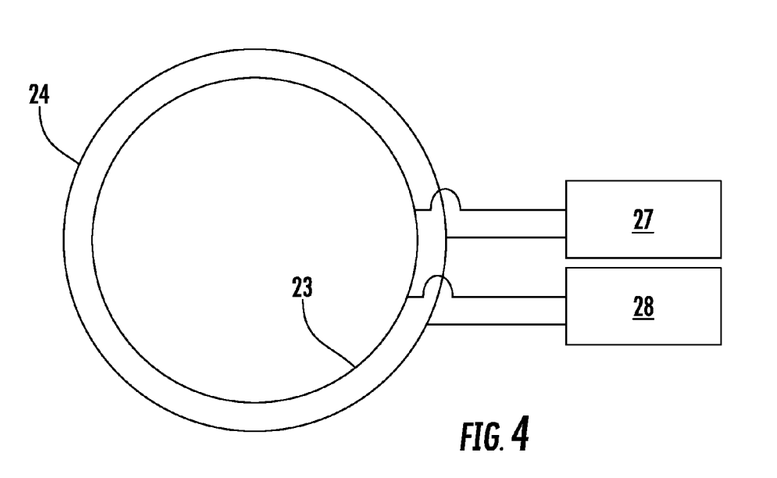
FIG. 4 is a perspective view of an exciting coil and a sensing coil.

FIG. 3 is a cross-sectional side view of an embodiment of an eddy current measurement system. The eddy current measurement system 22 includes an exciting coil 23 and a sensing coil 24. In this particular embodiment, the exciting coil 23 is disposed within the sensing coil 24, though other arrangements are possible. In one instance, the sensing coil 24 has a larger circumference or diameter than the exciting coil 23 and this exciting coil 23 is interior of the sensing coil 24 as seen in FIG. 4. In one specific embodiment, the sensing coil 24 is approximately 10 mm in diameter and is disposed between approximately 0.5 mm and 1 mm above the surface of the melt 10. The exciting coil 23 and sensing coil 24 may be fabricated of, for example, molybdenum or copper. In another instance, the exciting coil 23 and sensing coil 24 are combined into a single coil. This single coil is connected to a controller 27 that senses the small voltages produced by the eddy currents on top of the large cm rents used to excite the eddy currents.

Turning back to FIG. 3, a sleeve 25 surrounds both the exciting coil 23 and sensing coil 24. The sleeve 25 may be, for example, quartz or some other material that can withstand the temperature of the melt 10. In one instance, the sleeve 25 does not affect the fields generated using the eddy current measurement system 22. The eddy current measurement system 22 is disposed downstream of the cooling plate 14 and may be positioned above the melt 10 by a distance less than the diameter of the sensing coil 24 or exciting coil 23 loops. This eddy current measurement system 22 may be connected to a controller 27 that interprets a signal from the sensing coil 24. This controller 27 may provide process control during formation of the sheet 13. A power source 28 may selectively energize the sensing coil 24 and exciting coil 23. The frequency used may be, for example, 1.2 MHz, 8 MHz, or 100 MHz.

The exciting coil 23 of the eddy current measurement system 22 establishes a time-varying magnetic field. This imposed magnetic field induces a recirculating electromotive force (EMF). In a conductor, such as the melt 10, the EMF or movement between the EMF and the conductor produces an electrical loop or eddy current. Thus, a circulating flow of electrons is produced in the melt 10. Such an electrical loop or eddy current will produce an induced magnetic field or EMF. This induced magnetic field is of a polarity that partially cancels the imposed magnetic field or opposes the imposed magnetic field due to Lenz's Law. The stronger the imposed magnetic field, the greater the conductivity of the conductor, or the faster the imposed magnetic field changes, then the greater the eddy current generated and the greater the induced magnetic field.

Figure 5:
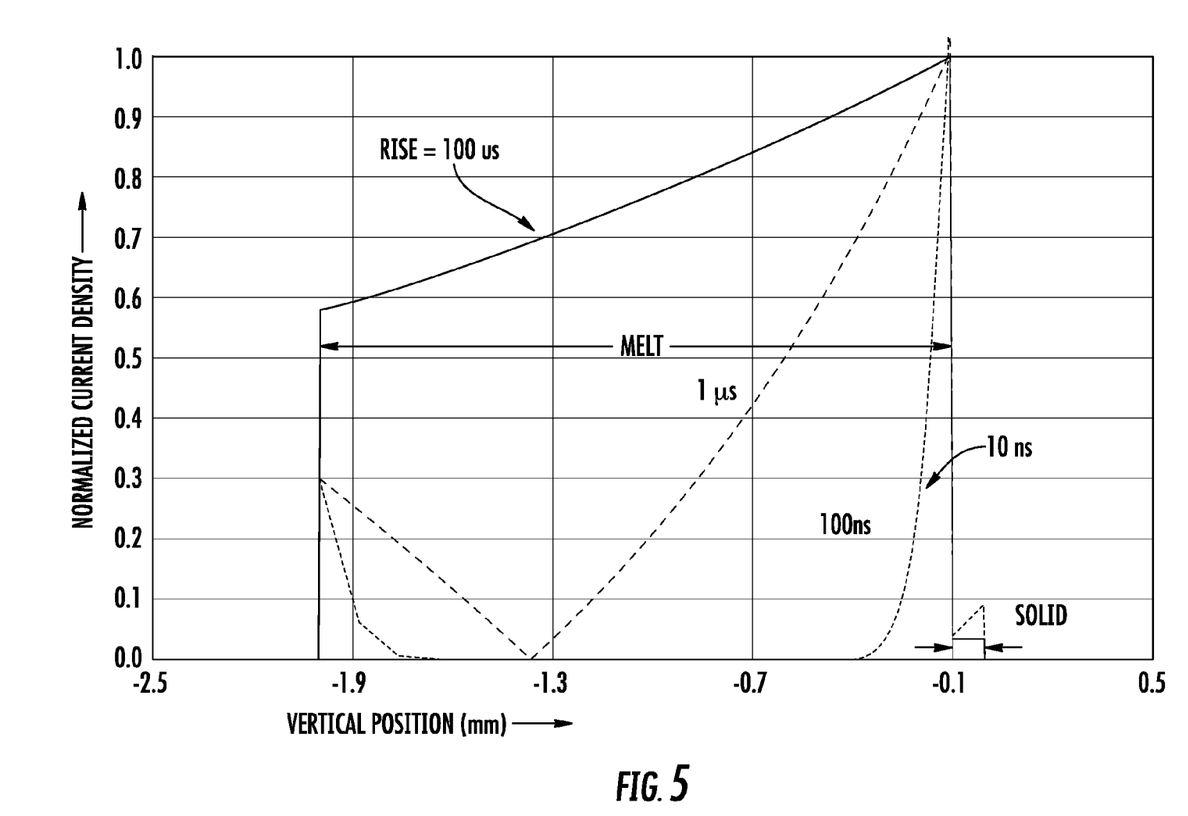
FIG. 5 is a chart comparing one embodiment of normalized current density versus vertical position.

The sensing coil 24 measures the time-dependent total field and may provide a signal corresponding to this field. From the magnitude and frequency dependence of the modification of the imposed field, the thickness of the sheet 13 may be determined. This thickness is illustrated in FIG. 3 by the arrows 26. FIG. 5 is a chart comparing one embodiment of normalized current density versus vertical position. FIG. 5 shows a model of the eddy current density as a function of depth for 100 μm of solid silicon on top of 1.9 mm of liquid silicon. A step function current in the energizing coil is modeled. The chart illustrates the time evolution of the eddy current in the period immediately following the start of the current. In the first few nanoseconds the solid film is a significant fraction of the total current because of the small high frequency skin depth, while as time progresses, the deeper liquid comes to dominate the response.

The solid silicon sheet 13 illustrated in FIG. 3 has a crystal structure that confines the wavefunctions of the electrons to eigenfunctions of the periodic potential. Thus, the conductivity of the sheet 13 is less than the melt 10 for silicon and the eddy currents will be dampened. There will be less of an induced magnetic field to measure for the sheet 13 than the melt 10 for silicon. The difference in the induced magnetic field for a region with both a sheet 13 and melt 10 will be different than just the melt 10, and the thickness of the sheet 13 may be calculated in part from this difference.

The controller 27 may use a two frequency harmonic approach. A low frequency is analyzed to measure the top of the melt 10. A high frequency is analyzed to measure the top of the sheet 13. The sheet 13 has a higher resistivity than the melt 10 in this instance. The thickness of the sheet 13 is estimated from the difference between the responses to the two frequencies. In another instance, more than two frequencies may be used, such as to help prevent noise from interfering with the measurement or to allow for a greater range of properties of the materials being measured. It is also possible to use multiple frequencies with a non-harmonic approach. This may use a step function or a discrete pulse of current in the exciting coil 23. Such a waveform implicitly contains a wide range of frequencies.

Figure 6:
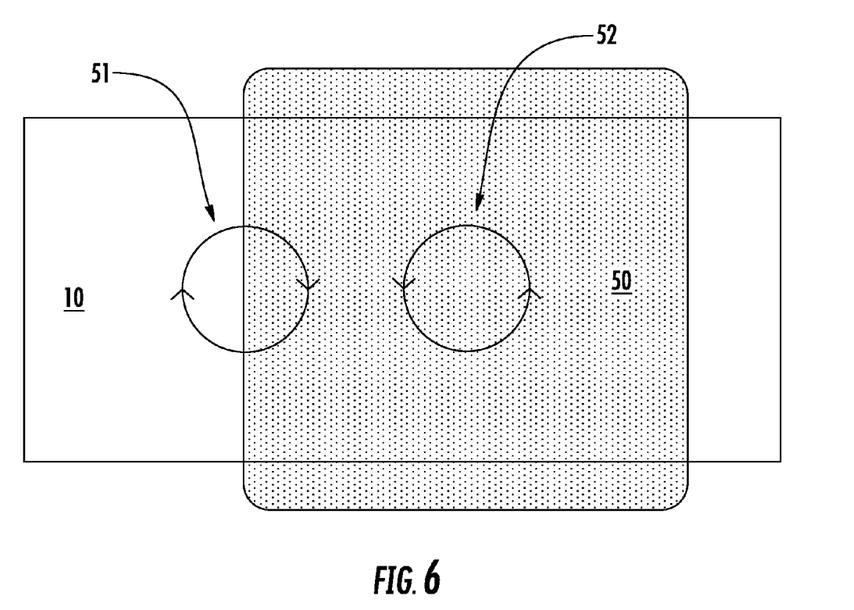
FIG. 6 is a top perspective view of an induced current in the melt.

FIG. 6 is a top perspective view of an induced current in the melt. FIG. 6 illustrates the top surface of the melt 10 looking down from the eddy current measurement system. The conduction electrons that make up the induced current in the melt 10 may swirl around in the melt 10 as if caught in an eddy or whirlpool of water. Thus, the imposed magnetic field 50 (represented by the dotted area in FIG. 6) causes the eddy current 51. This imposed magnetic field 50 has a current 52, such as within the exciting coil 23 of FIG. 3. Turning back to FIG. 6, this current 52 is opposite the eddy current 51. In one instance, both the current 52 and eddy current 51 are AC currents. The eddy current 51 generates its own induced magnetic field. Turning back to FIG. 3, the sensing coil 24 measures, in part, this induced magnetic field of the eddy current 51.

Figure 7:
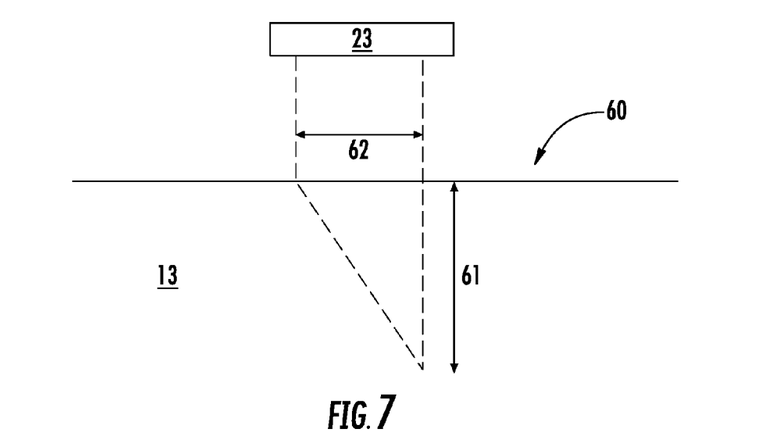
FIG. 7 is a cross-sectional side view of skin depth in a melt.

FIG. 7 is a cross-sectional side view of skin depth in a melt. The skin effect is the tendency of an AC current to distribute within a conductor such that the current density near the surface of the conductor is greater than that at its core. Solid silicon has a higher resistivity than liquid silicon, and, therefore, the skin depth is longer. The resistivity properties of other materials may be similar. As seen in FIG. 7, the field has strength 62 leaving the exciting coil 23. Below the surface 60 of the sheet 13, the strength decays. The skin depth will measure the field in the solid sheet 13 in the direction 61. Skin depth (d) may be calculated by using the equation:

$$d = \sqrt{(\rho/(\pi \mu_k \mu_0 f))}$$

In this equation, $\rho$ is the resistivity in $\Omega m$, f is the frequency in Hz, $\mu_k$ is relative permeability of the medium, and $\mu_0$ is magnetic permeability of vacuum, which for silicon is $4\pi E-7$ henry/meter. As seen in this equation, frequency, resistivity, and magnetic permeability all affect the skin depth.

Eddy currents concentrate near the surface of the conductor near the exciting coil, such as the exciting coil 23 in FIG. 7. The strength of the eddy currents decreases with the distance from the exciting coil 23. Thus, the induced magnetic field and eddy current decrease with depth due to skin effect. In one potential mechanism, the eddy currents near the surface 60 shield the magnetic field from the exciting coil 23, which weakens the imposed magnetic field at greater depths from the surface 60. Of course, other mechanisms are possible.

Skin effect affects eddy current measurements. Solid silicon and liquid silicon, for example, each have a different resistivity. Thus, each has a different skin depth for a particular frequency. This difference in skin depth may enable thickness measurements by comparison. For example, the thickness of a higher resistivity layer and a lower resistivity layer may be estimated using embodiments of the apparatus disclosed herein.

Figure 8:
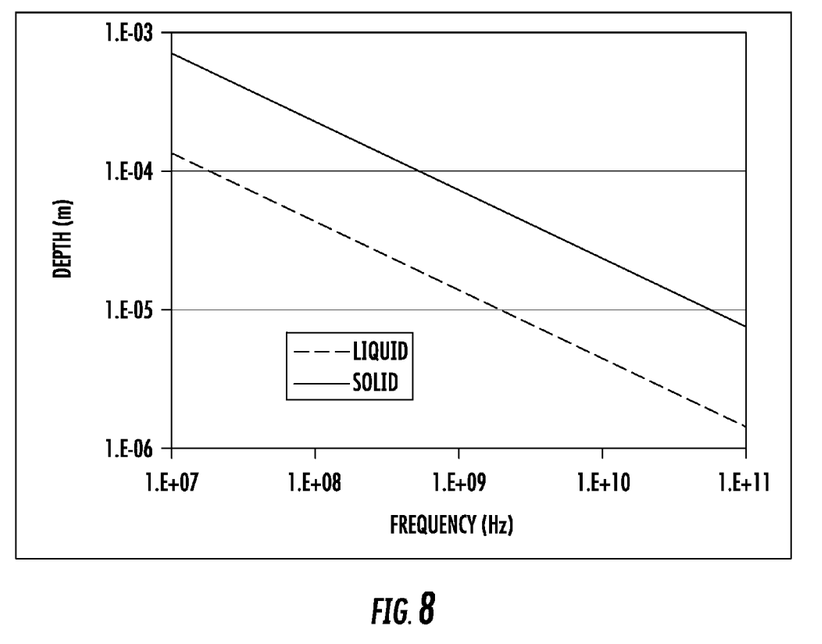
FIG. 8 is a chart comparing skin depth versus frequency.

FIG. 8 is a chart comparing skin depth versus frequency. By adjusting the frequency of the eddy current measurement system, such as with the exciting coil 23 of FIG. 3, the solid sheet or liquid melt may be measured. At high frequency, the solid sheet may be measured while at low frequency the liquid melt may be measured.

In one particular embodiment, the exciting coil 23 uses a step function in current. Of course, other non-periodic waveforms also may be used. This step function may have a relatively short rise time. Evaluating the shape of the rise of the resulting induced magnetic field or EMF may be performed as part of determining the thickness of a sheet.

The eddy current measurement system 22 illustrated in FIG. 3 may be used for real-time process control. Such real-time process control may be provided using the controller 27. Two parameters that may be adjusted in response to the thickness of the sheet 13 include the temperature of the cooling plate 14 or the speed of the movement of the melt 10 or sheet 13. For example, if the sheet 13 is too thick then the temperature of the cooling plate 14 may be raised or the speed of the melt 10 may be increased to reduce dwell time under the cooling plate 14. If the sheet 13 is too thin, then the temperature of the cooling plate may be lowered or the speed of the melt 10 may be decreased to increase dwell time under the cooling plate 14. Of course, other combinations or parameters also may be adjusted based on these measurements.

In one embodiment, both the solid and liquid being measured with the eddy current measurement system 22 are the same material, such as silicon. While measurements of solid and liquid silicon are specifically mentioned, other materials also may benefit from the embodiments disclosed herein.

The present disclosure is not to be limited in scope by the specific embodiments described herein. Indeed, various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A sheet-forming apparatus comprising:
   a melt of a material;
   a sheet of said material disposed in said melt, wherein said sheet has a higher resistivity than said melt;
   a cooling plate disposed a distance above a surface of said melt that is configured to form said sheet;
   an eddy current measurement system for providing real-time monitoring and feedback of a thickness of said sheet as it is formed in said melt, the eddy current measurement system comprising:
   an exciting coil and a sensing coil disposed a second distance above said surface of said melt downstream of said cooling plate; and
   a power source connected to said exciting coil; and
   a controller connected to said eddy current measurement system, said controller programmed to execute instructions to increase a temperature of said cooling plate if said sheet is thicker than desired and to decrease a temperature of said cooling plate if said sheet is thinner than desired.

2. The sheet-forming apparatus of claim 1, wherein said sheet floats on said melt.

3. The sheet-forming apparatus of claim 1, wherein said material is silicon.

4. The sheet-forming apparatus of claim 1, further comprising a quartz sleeve disposed around said exciting coil and said sensing coil.

5. The sheet-forming apparatus of claim 1, wherein said exciting coil and said sensing coil are composed of copper or molybdenum.

6. The sheet-forming apparatus of claim 1, further comprising a vessel configured to contain said melt and a spillway configured to separate said sheet from said melt.

7. The sheet-forming apparatus of claim 1, further comprising a pump configured to make said sheet and a surface of said melt flow at an equal speed.

8. The sheet-forming apparatus of claim 1, wherein said power source is configured to energize said exciting coil to produce a time-varying magnetic field.

9. The sheet-forming apparatus of claim 1, wherein said controller is configured to measure an induced magnetic field in said sensing coil, wherein said controller interprets a signal from said sensing coil to estimate a thickness of a higher resistivity layer disposed on top of a lower resistivity layer.

10. The sheet-forming apparatus of claim 1, wherein said exciting coil and said sensing coil are contained within a single coil.

11. The sheet-forming apparatus of claim 1, wherein one of said exciting coil and said sensing coil has a diameter, and wherein said second distance is less than said diameter.

12. The sheet-forming apparatus of claim 1, wherein said cooling plate is configured to use radiation cooling.

13. A sheet-forming apparatus comprising:
    a melt of a material;

a sheet of said material that floats on said melt, wherein said sheet has a higher resistivity than said melt;

a cooling plate disposed a distance above a surface of said melt that is configured to form said sheet, wherein said cooling plate is configured to use radiation cooling;

a pump configured to make said sheet and said melt flow; and an eddy current measurement system configured for real-time monitoring and feedback of a thickness of said sheet as it is formed on said melt, the eddy current measurement system comprising:

an exciting coil and a sensing coil disposed a second distance above said surface of said melt downstream of said cooling plate and; and a power source connected to said exciting coil; and a controller connected to said eddy current measurement system, said controller programmed to execute instructions to increase a speed of said melt if said sheet is thicker than desired and to decrease a speed of said melt if said sheet is thinner than desired.

14. The sheet-forming apparatus of claim 13, wherein said material is silicon.

15. The sheet-forming apparatus of claim 13, further comprising a quartz sleeve disposed around said exciting coil and said sensing coil.

16. The sheet-forming apparatus of claim 13, wherein said controller is configured to measure an induced magnetic field in said sensing coil, wherein said controller interprets a signal from said sensing coil to estimate a thickness of a higher resistivity layer disposed on top of a lower resistivity layer.

17. The sheet-forming apparatus of claim 13, wherein one of said exciting coil and said sensing coil has a diameter, and wherein said second distance is less than said diameter.

18. The sheet-forming apparatus of claim 13, wherein said power source is configured to energize said exciting coil to produce a time-varying magnetic field.

\* \* \* \* \*